United States Patent
Wu et al.

[11] Patent Number: 5,854,119
[45] Date of Patent: Dec. 29, 1998

[54] ROBUST METHOD OF FORMING A CYLINDER CAPACITOR FOR DRAM CIRCUITS

[75] Inventors: James Wu, Tze-Kuan; Yu-Hua Lee, Hsinchu; Jenn Ming Huang, Hsin-chu, all of Taiwan

[73] Assignee: Taiwan Semiconductor Manufacturing Company, Ltd., Hsin-Chu, Taiwan

[21] Appl. No.: 58,794

[22] Filed: Apr. 13, 1998

[51] Int. Cl.$^6$ .................................................. H01L 21/20
[52] U.S. Cl. .......................... 438/396; 438/239; 438/242; 438/253; 438/387
[58] Field of Search .................................... 438/239, 240, 438/242, 243, 244, 245, 248, 253, 386, 387, 391, 393, 396, 723, 724, 756, 757

[56] References Cited

U.S. PATENT DOCUMENTS

| | | | |
|---|---|---|---|
| 5,236,859 | 8/1993 | Bae et al. | 438/254 |
| 5,354,705 | 10/1994 | Mathews et al. | 438/398 |
| 5,389,568 | 2/1995 | Yun | 438/396 |
| 5,395,784 | 3/1995 | Lu et al. | 438/253 |
| 5,478,769 | 12/1995 | Lim | 438/396 |
| 5,498,562 | 3/1996 | Dennison et al. | 438/396 |
| 5,563,088 | 10/1996 | Tseng | 438/253 |
| 5,668,038 | 9/1997 | Huang et al. | 438/396 |
| 5,681,773 | 10/1997 | Tseng | 438/396 |
| 5,726,083 | 3/1998 | Takaishi | 438/240 |
| 5,733,808 | 3/1998 | Tseng | 438/239 |
| 5,753,547 | 5/1998 | Ying | 438/253 |

OTHER PUBLICATIONS

C.Y. Chang & S.M. Sze, "ULSI Technology" The McGraw–Hill Companies, Inc., 1996. pp. 444–445.

*Primary Examiner*—Charles Bowers
*Assistant Examiner*—Jack Chen
*Attorney, Agent, or Firm*—George O. Saile; Stephen B. Ackerman; Larry J. Prescott

[57] ABSTRACT

A method of forming a capacitor for DRAM or other circuits is described which avoids the problem of weak spots or gaps forming between a polysilicon contact plug and the first capacitor plate. A layer of first dielectric is formed on a substrate, A layer of second dielectric is formed on the layer of first dielectric. A layer of third dielectric is formed on the layer of second dielectric. A first hole is formed in the first, second, and third dielectrics exposing a contact region of the substrate. The first hole is then filled with a protective material and a second hole is formed in the layer of third dielectric using the layer of second dielectric as an etch stop. The first hole lies within the periphery of the second hole. The protective material prevents re-deposition of the third dielectric. The remaining protective material is then removed and a layer of conducting material is formed on the top surface of the layer of third dielectric, the sidewalls of the second hole, the sidewalls of the first hole, and the contact region of the substrate thereby forming a first capacitor plate.

20 Claims, 6 Drawing Sheets

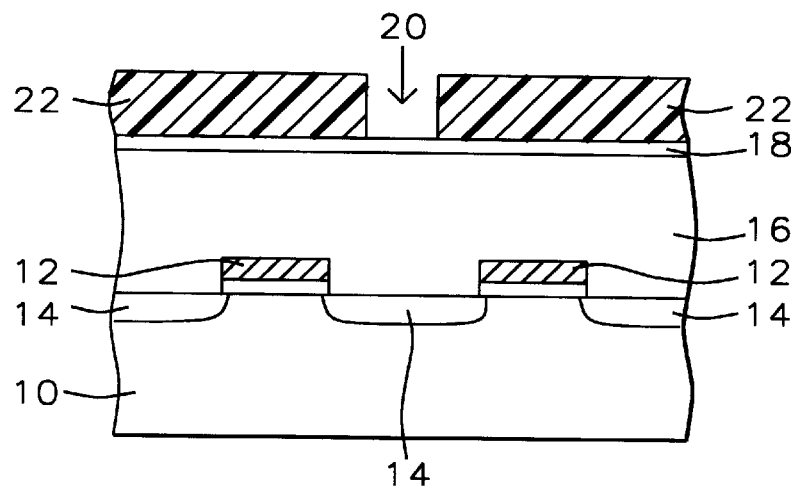
FIG. 1 – Prior Art
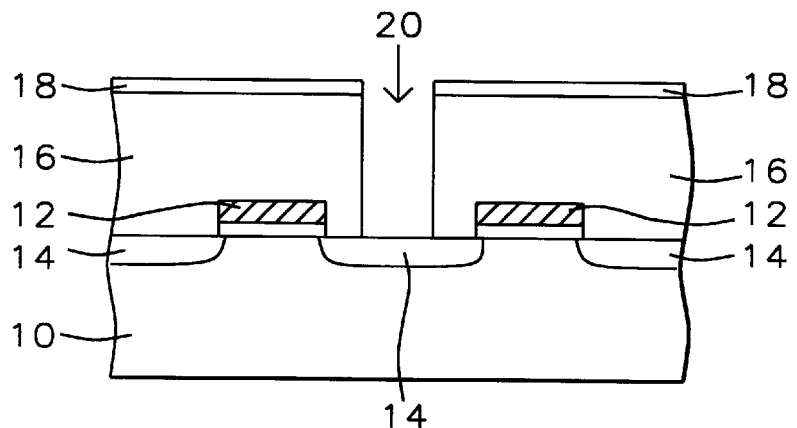
FIG. 2 – Prior Art
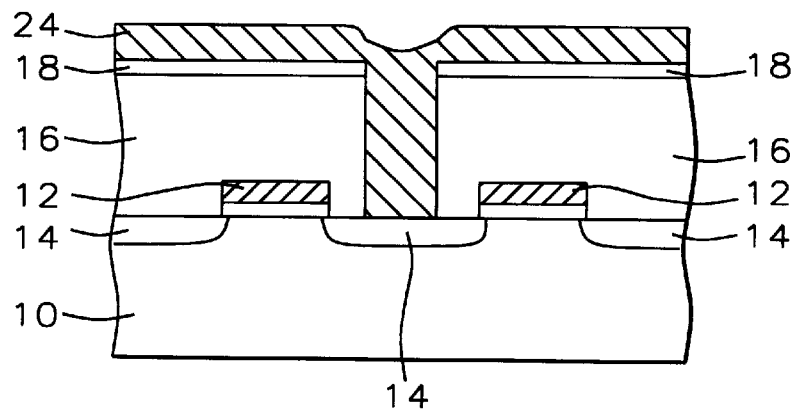
FIG. 3 – Prior Art

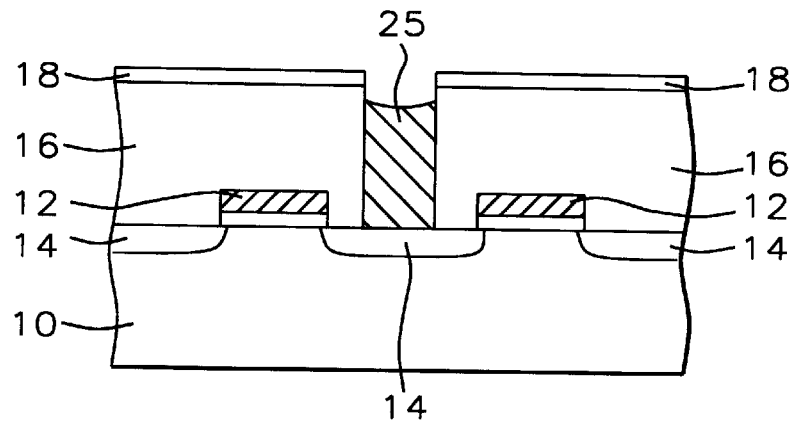
FIG. 4 - Prior Art
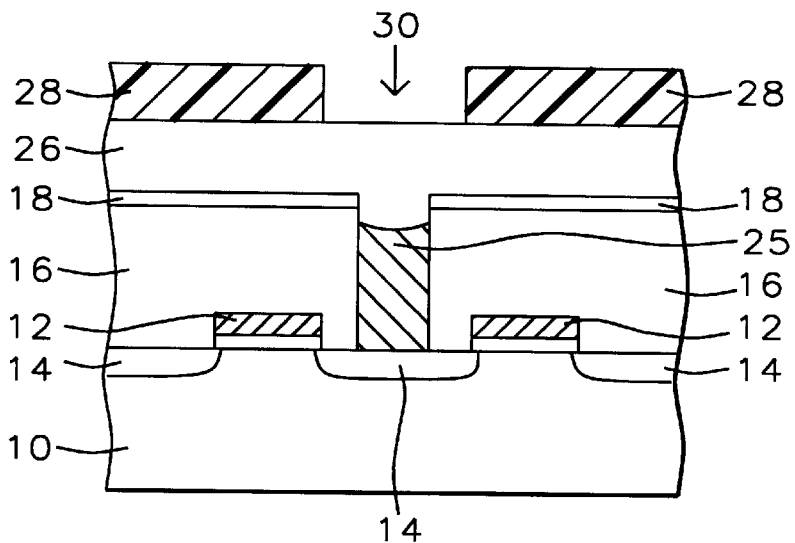
FIG. 5 - Prior Art
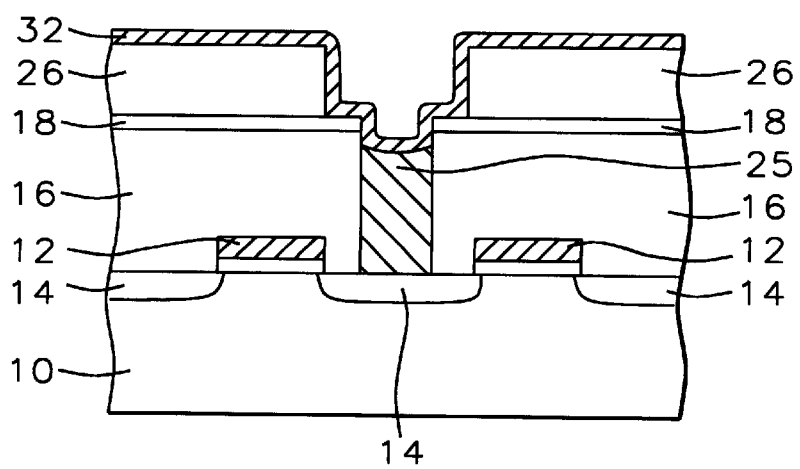
FIG. 6 - Prior Art

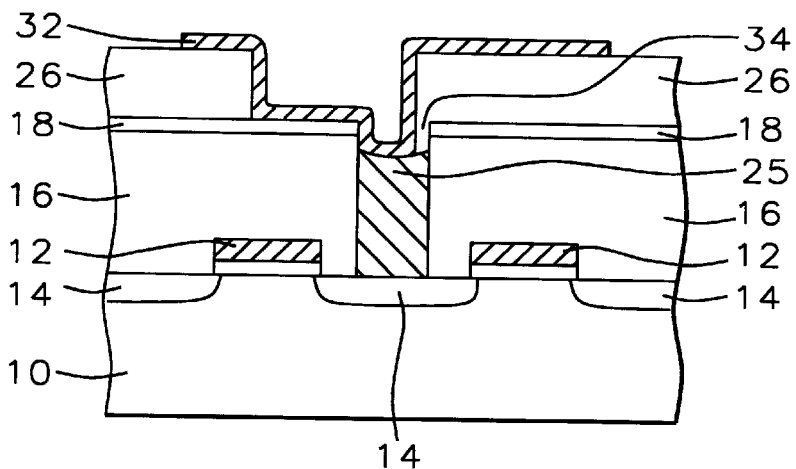
FIG. 7 - Prior Art
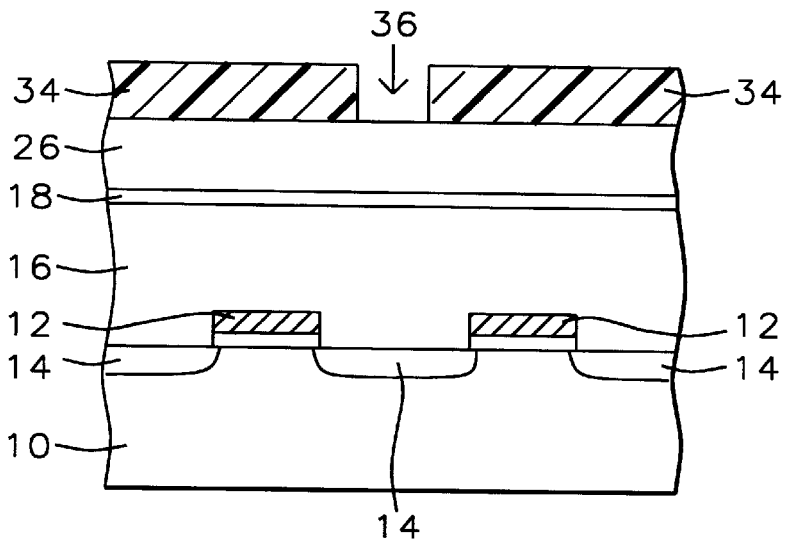
FIG. 8
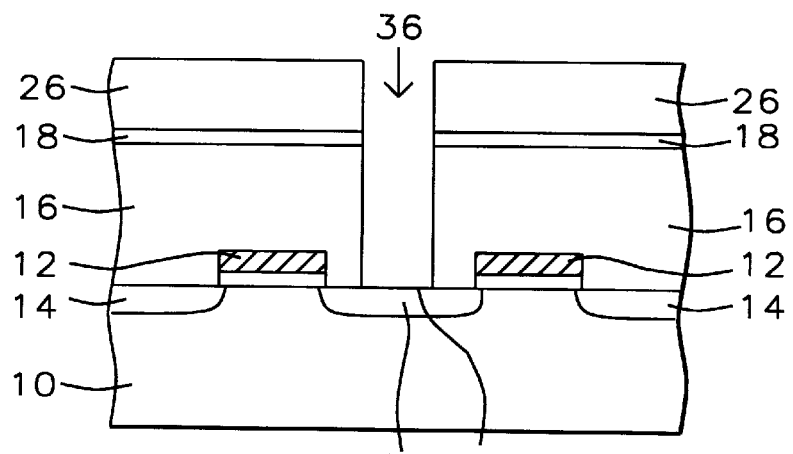
FIG. 9

5,854,119

ROBUST METHOD OF FORMING A CYLINDER CAPACITOR FOR DRAM CIRCUITS

BACKGROUND OF THE INVENTION (1) Field of the Invention

This invention relates to a method of forming a cylinder type capacitor for dynamic random access memory, DRAM, or other circuits and more particularly to a method which avoids the formation of gaps or weak spots in the capacitor structure.

(2) Description of the Related Art

A damascene process is described in the book "ULSI Technology", by C. Y. Chang and S. M. Sze, The McGraw-Hill Companies, Inc., 1996, pages 444–445.

U.S. Pat. No. 5,354,705 to Mathews et al. describes a method for forming conductive container structures on a supporting substrate of a semiconductor device.

U.S. Pat. No. 5,389,568 to Yun describes a method of forming a capacitor for a DRAM circuit. The storage node of the capacitor is connected to the semiconductor substrate through a hole formed in an insulating layer.

U.S. Pat. No. 5,498,562 to Dennison et al. describes methods of forming stacked capacitors.

SUMMARY OF THE INVENTION

Many types of integrated circuits, particularly dynamic random access memory or DRAM circuits, have capacitors as an integral part of the circuit. In order to achieve sufficient capacitance for proper operation of the circuits the capacitor plates often extend over the area of the integrated circuit separated from the circuit devices by one or more layers of dielectric. A conducting path must be formed from one of the capacitor plates through the layers of dielectric to make contact with the circuit devices.

A conventional method of forming a capacitor with a connection to the circuit devices is shown in FIGS. 1–7. FIG. 1 shows a part of a DRAM circuit with an integrated circuit wafer 10 having diffusion regions 14 formed therein. Gate electrodes 12 forming word lines are formed on the integrated circuit wafer. A first layer of silicon oxide 16 is formed on the wafer 10 and a layer of silicon nitride 18 is formed on the first layer of silicon oxide 16. A first layer of photoresist 22 is then formed on the layer of silicon nitride 18 and patterned to form a first photoresist mask for forming a contact hole 20.

As shown in FIG. 2, the contact hole 20 is then etched in the layer of silicon nitride 18 and the first layer of silicon oxide 16 exposing a contact region on the surface of the wafer 10. As shown in FIG. 3, a layer of polysilicon 24 is then formed on the wafer filling the contact hole. As shown in FIG. 4, the polysilicon is then etched back leaving a polysilicon plug 25 in the contact hole making contact with the contact region on the wafer. A second layer of silicon oxide 26 is then formed on the wafer and a second layer of photoresist 28 is formed on the second layer of silicon oxide 26, see FIG. 5. The second layer of photoresist is then patterned to form a second photoresist mask for forming a capacitor hole 30.

As shown in FIG. 6, the capacitor hole is then etched in the second layer of silicon oxide using the layer of silicon nitride as an etch stop. A layer of polysilicon 32 is then formed on the sidewalls of the capacitor hole and the top surface of the second layer of silicon oxide 26 making contact with the polysilicon plug 25 and forming a first capacitor plate. FIG. 6 shows the case of good alignment of the capacitor hole to the contact hole. FIG. 7 shows problems caused by poor alignment between the capacitor hole and the contact hole. As shown in FIG. 7 when the capacitor hole is misaligned with respect to the contact hole a gap 34 can be formed between the polysilicon layer 32 forming the first capacitor plate and the sidewall of the contact hole. This gap 34 creates a weak spot in the first capacitor plate and can lead to processing and reliability problems.

It is a principle objective of this invention to provide a method of forming a capacitor which avoids the problems described above.

This objective is achieved by forming a layer of first dielectric on the wafer, a layer of second dielectric on the layer of first dielectric, and a layer of third dielectric on the layer of second dielectric. A contact hole is then formed in the layer of first dielectric, the layer of second dielectric, and the layer of third dielectric. The contact hole is then filled with a protective material. A capacitor hole is then formed in the layer of third dielectric using the layer of second dielectric as an etch stop. The protective material is then removed, for example, using $H_2SO_4/H_2O_2$ as an etchant. A layer of conductor material is then formed on the top surface of the layer of third dielectric, the sidewalls of the capacitor hole, and the sidewalls of the contact hole making contact to the contact region of the wafer and forming a first capacitor plate. As will be seen in the detailed description which follows this method of forming a capacitor avoids the problems described above.

BRIEF DESCRIPTION OF THE DRAWINGS

FIG. 1 shows a cross section view of an integrated circuit wafer having a first layer of silicon oxide, a layer of silicon nitride, and a first photoresist mask formed thereon.

FIG. 2 shows a cross section of the integrated circuit wafer of FIG. 1 after the contact hole has been formed.

FIG. 3 shows a cross section view of the integrated circuit wafer of FIG. 2 after a layer of polysilicon has been formed on the wafer.

FIG. 4 shows a cross section view of the integrated circuit wafer of FIG. 3 after the polysilicon has been etched back to form a polysilicon plug.

FIG. 5 shows a cross section view of the integrated circuit wafer of FIG. 4 after forming a second layer of silicon oxide and a second photoresist mask.

FIG. 6 shows a cross section view of the integrated circuit wafer after the first capacitor plate has been formed for the case of good alignment between the capacitor hole and the contact hole.

FIG. 7 shows a cross section view of the integrated circuit wafer after the first capacitor plate has been formed for the case of poor alignment between the capacitor hole and the contact hole.

FIG. 8 shows a cross section view of an integrated circuit wafer having a layer of first dielectric, a layer of second dielectric, a layer of third dielectric, and a first photoresist mask formed thereon.

FIG. 9 shows a cross section view of the integrated circuit wafer of FIG. 8 after forming a contact hole in the layer of first dielectric, the layer of second dielectric, and the layer of third dielectric.

DESCRIPTION OF THE PREFERRED EMBODIMENTS

Figure 10:
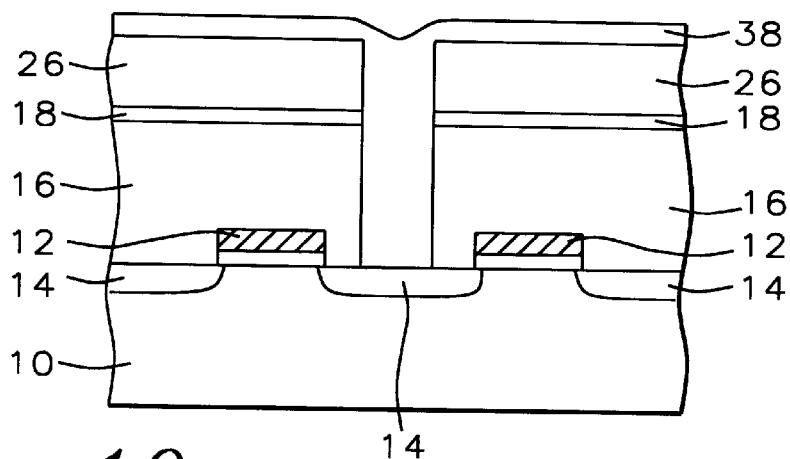
FIG. 10 shows a cross section view of the integrated circuit wafer of FIG. 9 after the contact hole has been filled with protective material.

Refer now to FIGS. 8–13B for a description of the preferred embodiment of a method of forming a capacitor of this invention. FIG. 8 shows a part of a DRAM circuit with an integrated circuit wafer 10 having diffusion regions 14 formed therein. Gate electrodes 12 forming word lines are formed on the integrated circuit wafer. A layer of first dielectric 16 is formed on the wafer 10, a layer of second dielectric 18 is formed on the layer of first dielectric 16, and a layer of third dielectric 26 is formed on the layer of second dielectric. A first layer of photoresist 34 is then formed on the layer of third dielectric 26 and patterned to form a first photoresist mask for forming a first hole 36, which is the contact hole.

This embodiment uses the example of a capacitor formed as part of a DRAM circuit. Those skilled in the art will readily recognize that the capacitor could be formed as part of other types of circuits or for other applications. The layer of first dielectric can be, for example, a layer of silicon oxide having a thickness of between about 3000 and 8000 Angstroms. The layer of second dielectric can be, for example, a layer of silicon nitride having a thickness of between about 200 and 1000 Angstroms, and the layer of third dielectric can be, for example, a layer of silicon oxide having a thickness of between about 3000 and 10,000 Angstroms. The second dielectric and third dielectric are chosen so that the third dielectric can be etched at an etch rate greater than the etch rate of the second dielectric, because in later steps the layer of second dielectric will be used as an etch stop in etching the layer of third dielectric.

As shown in FIG. 9, a first hole 36, having sidewalls, is then etched in the layer of third dielectric 26, the layer of second dielectric 18, and the layer of first dielectric 16 thereby exposing the contact region 37 on the surface of the wafer 10 which is that part of the wafer surface where contact to the circuit will be made. The first layer of photoresist is then stripped. The first hole is formed using dry anisotropic etching. In this example $CF_4/CHF_3$ is used as an etchant for the first and third dielectrics, in this example silicon oxide, and $CF_4/CHF_3/SF_6$ is used as an etchant for the second dielectric, in this example silicon nitride. Next, as shown in FIG. 10, the contact hole 36 is filled with a protective material 38 which is also formed on the top surface of the layer of third dielectric 26. In this example the protective material 38 is an organic material bottom anti-reflective coating.

Figure 11A:
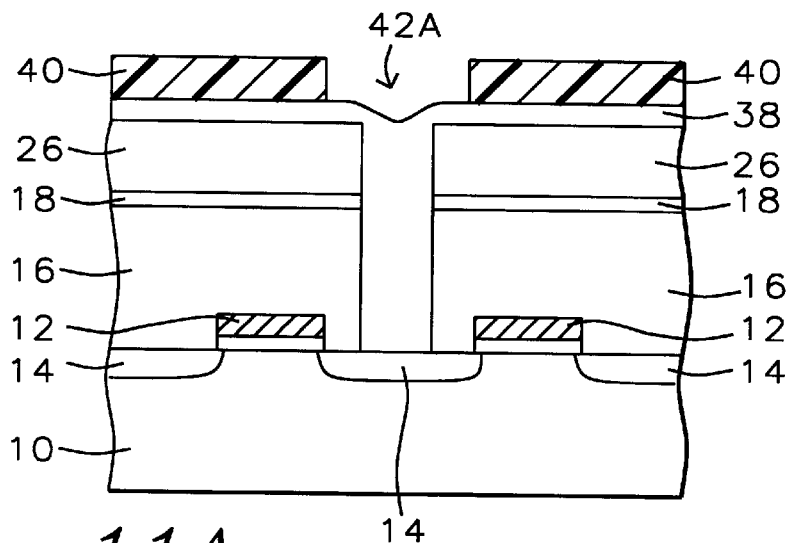
FIG. 11A shows a cross section view of the integrated circuit wafer of FIG. 10 after a photoresist mask has been formed on the wafer with good alignment.
Figure 11B:
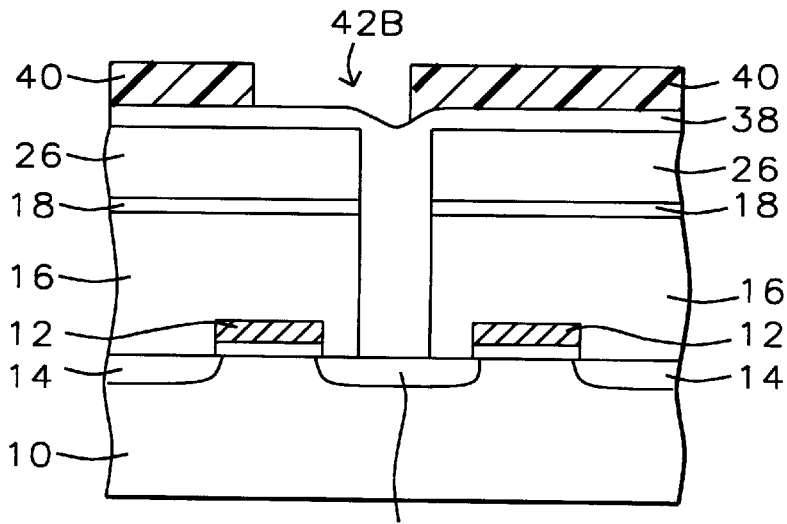
FIG. 11B shows a cross section view of the integrated circuit wafer of FIG. 10 after a photoresist mask has been formed on the wafer with poor alignment.

As shown in FIGS. 11A and 11B, a second layer of photoresist 40 is then formed on the protective material 38, in this example bottom anti-reflective material, and patterned to form a second photoresist mask for forming a second hole, which is the contact hole. In FIG. 11A the second photoresist mask is aligned properly so that the second hole 42A is in proper alignment. In FIG. 11B the second photoresist mask is mis-aligned so that the second hole 42B is mis-aligned with respect to the first hole.

Figure 12A:
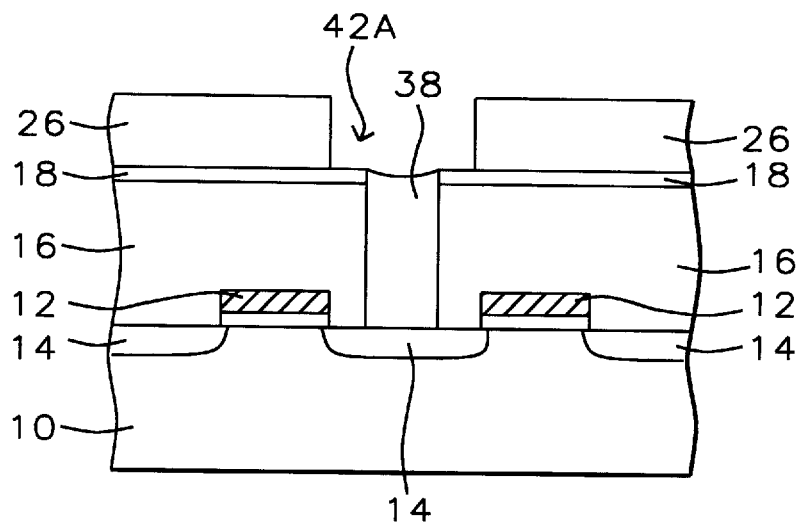
FIG. 12A shows a cross section view of the integrated circuit wafer of FIG. 10 after a capacitor hole has been formed in the layer of third dielectric using the photoresist mask with good alignment.
Figure 12B:
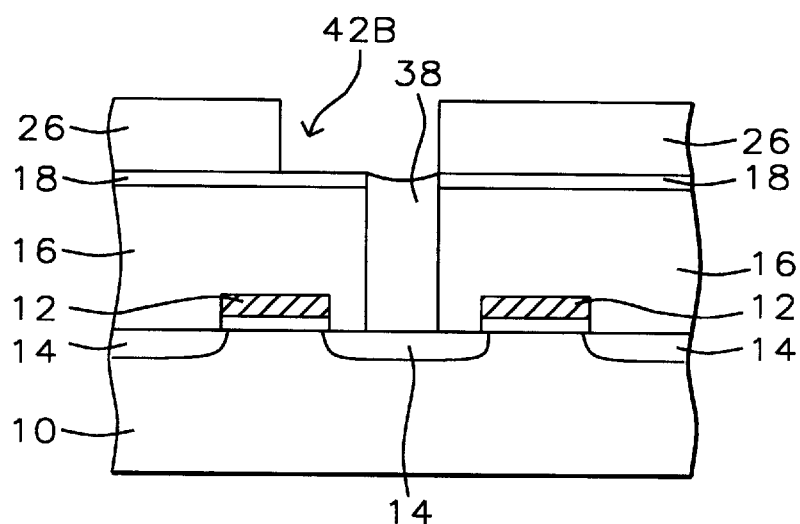
FIG. 12B shows a cross section view of the integrated circuit wafer of FIG. 10 after a capacitor hole has been formed in the layer of third dielectric using the photoresist mask with poor alignment.

Next, as shown in FIGS. 12A and 12B, the second hole having sidewalls is formed in the layer of third dielectric 26 using dry anisotropic etching and the layer of second dielectric 18 as an etch stop. The protective material in the second hole, 42A or 42B, is also removed when the second hole is formed. The protective material 38 in the first hole prevents any of the third dielectric from redepositing in the first hole or on the sidewalls of the first hole. The second hole is etched using dry anisotropic etching and, in this example, $O_2/N_2$ as an etchant. The second layer of photoresist is then stripped and the protective material is removed from the top of the layer of third dielectric. The first hole lies within the periphery of the second hole. FIG. 12A shows the second hole 42A in proper alignment and FIG. 12B shows the second hole 42B misaligned. As shown in FIGS. 12B, the case of a mis-aligned second hole 42B does not result in an overhang of a part of the layer of third dielectric 26 extending beyond the layer of second dielectric 18 or layer of first dielectric 16 so that gaps can not be formed, as is the case in the conventional method.

Figure 13A:
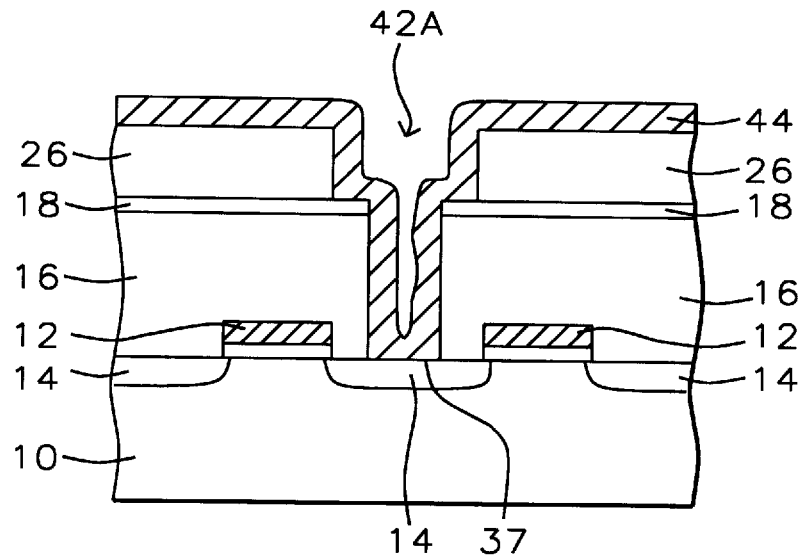
FIG. 13A shows a cross section view of the integrated circuit wafer of FIG. 10 after a first capacitor plate has been formed using the capacitor hole with good alignment.
Figure 13B:
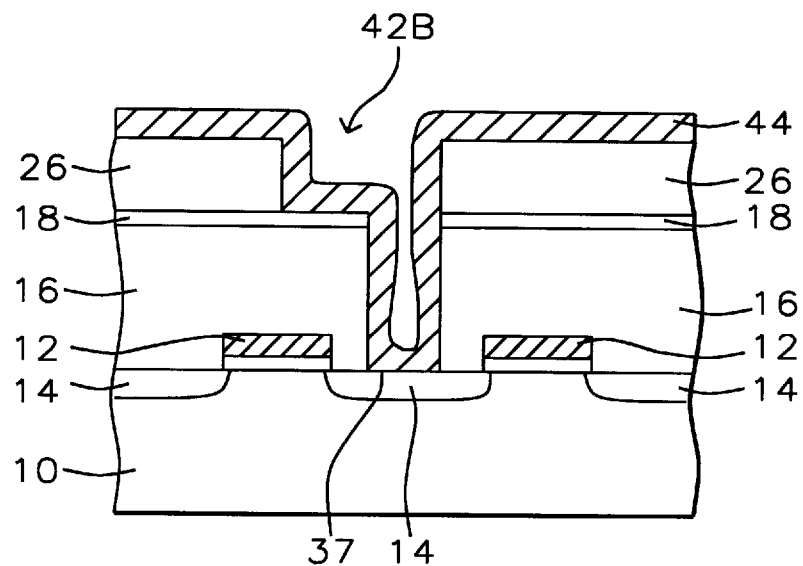
FIG. 13B shows a cross section view of the integrated circuit wafer of FIG. 10 after a first capacitor plate has been formed using the capacitor hole with poor alignment.

As shown in FIGS. 13A and 13B, a layer of conducting material 44, in this example polysilicon, is formed on the top of the layer of third dielectric 26, the sidewalls of the second hole in the layer of third dielectric 26, the sidewalls of the first hole in the layer of second dielectric 18 and the layer of first dielectric 16, and the contact region 37 of the surface of the wafer 10 thereby forming a first capacitor plate of first conducting material and contact to the contact region 37 of the integrated circuit wafer 10. FIG. 13A shows the case where the second hole 42A is properly aligned to the first hole and FIG. 13B shows the case where the second hole 42B is mis-aligned with respect to the first hole. In this method, however, the case of the mis-aligned second hole 42B with respect to the first hole does not result in gaps or weak points, as is the case with the conventional method.

After the formation of the conducting layer 44 forming the first capacitor plate, the capacitor is completed using conventional methods to form the second capacitor plate.

While the invention has been particularly shown and described with reference to the preferred embodiments thereof, it will be understood by those skilled in the art that various changes in form and details may be made without departing from the spirit and scope of the invention.

What is claimed is:

1. A method of forming capacitors, comprising the steps of:

providing a substrate having a contact region;

forming a layer of first dielectric on said substrate;

forming a layer of second dielectric on said layer of first dielectric;

forming a layer of third dielectric on said layer of second dielectric;

etching a first hole having sidewalls in said layer of first dielectric, said layer of second dielectric, and said layer of third dielectric thereby exposing said contact region;

filling said first hole with a protective material;

etching a second hole having sidewalls in said layer of third dielectric, wherein said first hole lies within the periphery of said second hole;

removing the remaining said protective material thereby exposing said contact region;

forming a layer of conductive material on said layer of third dielectric, said sidewalls of said second hole, said sidewalls of said first hole, and said contact region; and patterning said layer of conductive material thereby forming a first capacitor plate.

2. The method of claim 1 wherein said layer of first dielectric is a layer of silicon oxide having a thickness of between about 3000 and 8000 Angstroms.

3. The method of claim 1 wherein said layer of second dielectric is a layer of silicon nitride having a thickness of between about 200 and 1000 Angstroms.

4. The method of claim 1 wherein said layer of third dielectric is a layer of silicon oxide having a thickness of between about 3000 and 10,000 Angstroms.

5. The method of claim 1 wherein said etching said first hole having sidewalls uses dry anisotropic etchants of $CF_4/CHF_3$ and $CF_4/CHF_3/SF_6$.

6. The method of claim 1 wherein said etching said second hole having sidewalls uses dry anisotropic etching, an etchant of $O_2/N_2$, and said layer of second dielectric as an etch stop.

7. The method of claim 1 wherein said conductive material is polysilicon.

8. The method of claim 1 wherein said removing the remaining said protective material uses $H_2SO_4/H_2O_2$.

9. The method of claim 1 wherein said substrate is a silicon integrated circuit wafer having devices formed therein.

10. The method of claim 1 wherein said substrate is a silicon integrated circuit wafer having dynamic random access memory circuits formed therein.

11. A method of forming capacitors, comprising the steps of:

providing a substrate having a first surface and a contact region on said first surface;

forming a layer of first dielectric on said first surface of said substrate;

forming a layer of second dielectric on said layer of first dielectric;

forming a layer of third dielectric having a top surface on said layer of second dielectric;

etching a first hole having sidewalls in said layer of first dielectric, said layer of second dielectric, and said layer of third dielectric thereby exposing said contact region of said first surface of said substrate;

filling said first hole in said layer of first dielectric, said layer of second dielectric, and said layer of third dielectric with a protective material thereby covering said contact region of said first surface of said substrate with said protective material;

etching a second hole having sidewalls in said in said layer of third dielectric using said layer of second dielectric as an etch stop, wherein said first hole lies within the periphery of said second hole, thereby removing said protective material from said second hole in said layer of third dielectric;

removing the remaining said protective material thereby exposing said contact region of said first surface of said substrate;

forming a layer of conductive material on said top surface of said layer of third dielectric, said sidewalls of said second hole in said layer of said third dielectric, said sidewalls of said first hole in said layer of second dielectric, said sidewalls of said first hole in said layer of first dielectric, and said contact region of said first surface of said substrate; and patterning said layer of conductive material thereby forming a first capacitor plate.

12. The method of claim 11 wherein said layer of first dielectric is a layer of silicon oxide having a thickness of between about 3000 and 8000 Angstroms.

13. The method of claim 11 wherein said layer of second dielectric is a layer of silicon nitride having a thickness of between about 200 and 1000 Angstroms.

14. The method of claim 11 wherein said layer of third dielectric is a layer of silicon oxide having a thickness of between about 3000 and 10,000 Angstroms.

15. The method of claim 11 wherein said etching said first hole having sidewalls in said layer of first dielectric, said layer of second dielectric, and said layer of third dielectric uses dry anisotropic etchants of $CF_4/CHF_3$ and $CF_4/CHF_3/SF_6$.

16. The method of claim 11 wherein said etching said second hole having sidewalls in said layer of third dielectric uses dry anisotropic etching and an etchant of $O_2/N_2$.

17. The method of claim 11 wherein said conductive material is polysilicon.

18. The method of claim 11 wherein said removing the remaining said protective material uses $H_2SO_4/H_2O_2$.

19. The method of claim 11 wherein said substrate is a silicon integrated circuit wafer having devices formed therein.

20. The method of claim 11 wherein said substrate is a silicon integrated circuit wafer having dynamic random access memory circuits formed therein.

* * * * *